United States Patent [19]
Arimoto et al.

[11] 3,935,483
[45] Jan. 27, 1976

[54] PHASE SHIFTING CIRCUIT

[75] Inventors: Kazuyuki Arimoto; Toshinobu Maeda; Fuzio Hori; Akihiko Takata, all of Kadoma, Japan

[73] Assignee: Matsushita Electric Industrial Co., Ltd., Kadoma, Japan

[22] Filed: Feb. 25, 1974

[21] Appl. No.: 445,159

[30] Foreign Application Priority Data
Feb. 26, 1973 Japan............................ 48-22874

[52] U.S. Cl. ............... 307/295; 307/228; 307/262; 328/133; 328/158
[51] Int. Cl.² ......................................... H03K 1/16
[58] Field of Search................. 307/228, 262, 295; 328/133, 158

[56] References Cited
UNITED STATES PATENTS
| | | | |
|---|---|---|---|
| 2,956,178 | 10/1960 | Gott | 307/228 X |
| 3,201,611 | 8/1965 | Mollinga | 307/228 X |
| 3,319,172 | 5/1967 | Tong | 328/133 |

Primary Examiner—John Kominski
Assistant Examiner—Lawrence J. Dahl

[57] ABSTRACT

A phase shifting circuit having a first delay element with a time constant $\tau_1$, a second delay element with a time constant $\tau_2$ smaller than $\tau_1$ and a pulse generating element such as p-n-p-n transistor produces phase shifting pulses with respect to a reference phase upon application of a step-up voltage to the first delay element and periodic pulses to the second delay element. The two signals rise at different rate following respective curves and the two curves intersect at various points. The pulses generating element compares the two signals and produces a pulse at the instant the two signals coincides at the intersecting points. The phase shifting pulses have a linear phase relation with respect to the reference phase which is equal to the phase of the periodic pulses applied to the second delay element.

6 Claims, 5 Drawing Figures

PHASE SHIFTING CIRCUIT

The present invention relates generally to phase shift circuits, more particularly to a phase shift circuit which produces recurrent pulses having a linearly shifting phase relation with respect to a reference phase.

Phase shifting is accomplished in various ways. One prior art example is to use an a.c. bridge circuit comprising a transformer with a mid-tapped secondary to form two bridge arms having equal induced voltages. The other two arms are made up of an inductance or a capacitance and a resistance. The variation in phase shift is produced by a variation of the resistance, inductance or capacitance. The variation in the phase may be secured by replacing the inductance with a saturable reactor connected to a d.c. supply and varying the d.c. current through the reactor. Another prior art includes the selsyn (Self-synchronous) using electric motors. However, in these prior art phase shifters, phase shifting is only attainable by mechanical means and the range of variation is limited to within less than 180°.

Therefore, an object of the present invention is to provide an improved phase shift circuit wherein phase shift is accomplished full-electronically.

Another object of the invention is to provide an improved phase shifter wherein the phase shift is accomplished through a range of 360°.

A further object of the invention is to provide an improved phase shifter in a much simpler construction than the prior art phase shifters.

Still another object is to provide an improved phase shifter wherein the phase shifting characteristic is kept stablized with minimized effect of ambient temperatures.

Still another object is to provide an improved phase shifter which produces recurrent pulses each having a linearly shifting phase relation with a reference phase.

Briefly described, the present invention contemplates to use a step-up function voltage and a train of regularly occurring pulses, the former being applied to a first time constant circuit having a first value of time constant and the latter being applied to a second time constant circuit having a second time constant smaller than the former. A pulse producing element such as a p-n-p-n transistor or a silicon-controlled rectifier is connected to the time constant circuits. Upon energization of the phase shifter, the step-up function voltage rises at a rate determined by the first time constant while the amplitude of the pulses rises at a much higher rate than the former. Whenever the two voltages coincide, a sharp pulse is produced as the output of the pulse producing element. As the step-up function voltage rises to a constant value, a number of coincidences occur, the number being determined by the rate at which the two input voltages rise and the repetition frequency of the recurrent pulses. The output sharp pulses have a linearly shifting phase relation with the input recurrent pulses, with the phase shifting from zero to 360°.

The step-up function voltage may be dispensed with when a third time constant circuit having a time constant smaller than the second time constant is employed for storage of electrical energy upon energization of the phase shifter. The stored electrical energy is discharged through the first time constant circuit. Since the voltage across the first time constant circuit falls gradually in a reversed manner, the phase is substantially shifted from 360° to 0°.

The present invention will find an application for timing operations. A pulse generator is provided to produce a train of pulses occurring at a constant interval equal to that of the phase shifting pulses in order to serve as a reference phase source. When coincidence occurs between the two trains of pulses, an output is produced indicating that predetermined period of time has elapsed.

These and other objects and features of the present invention will become apparent when read in conjunction with the accompanying drawings, in which.

Figure 1:
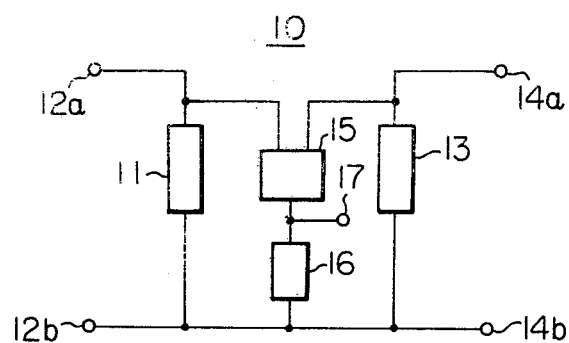
FIG. 1 is a schematic circuit block diagram of a phase shifting circuit for illustration of the principle of the present invention.
Figure 2:
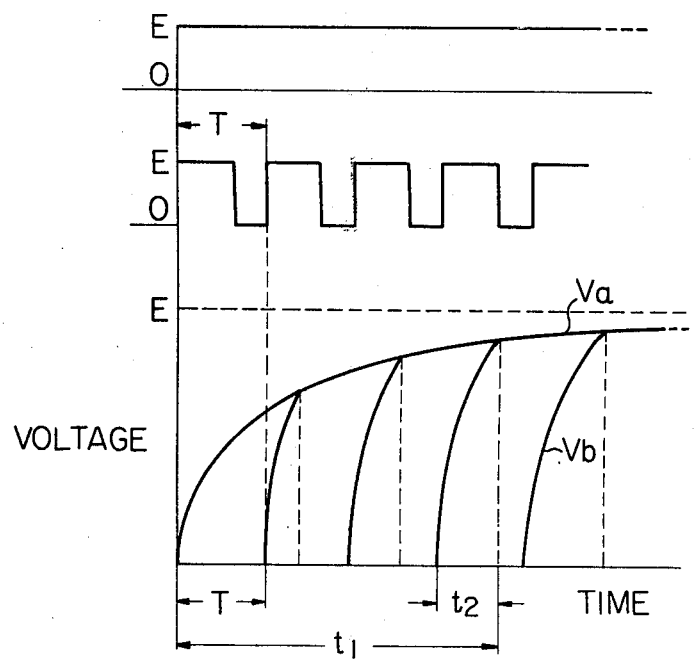
FIG. 2 is a graph showing curves of two voltages applied to the input terminals of the phase shifting circuit of FIG. 1.

Reference is now made to the drawings, in particular to FIG. 1 wherein a fundamental block diagram embodying the present invention is shown generally at a reference numeral 10 and comprises a first delay circuit or element 11 connected across input terminals 12a and 12b and a second delay circuit or element 13 connected across input terminals 14a and 14b. The first and second delay elements are practically a resistor-capacitor (RC) circuit element having time constant $\tau_1$, and $\tau_2$, respectively, the former being greater than the latter. To the input terminals 12a and 12b is applied a step-up voltage E and to the input terminals 14a and 14b is applied periodic pulses occurring at an interval T having a peak amplitude E. A pulse generating element 15 such as p-n-p-n transistor or silicon-controlled rectifier is connected to the first and second delay elements to receive the delayed signals. The pulse producing element of this type is usually used as a switching element, but produces a pulse when two input signals of equal amplitude are applied simultaneously thereto. The step-up voltage when applied to the first delay element 11 rises exponentially to the voltage E at a rate much lower than the rate at which each of the periodic pulses rises exponentially as shown in voltage curve $V_a$ of FIG. 2 to the voltage E. On the other hand, the pulses applied to input terminals 14a and 14b rise exponentially in curves $V_b$ shown in FIG. 2. These curves intersect each other at periodic intervals. The pulse generating element 15 produces a pulse at each of the intersections of the two voltage curves and applies it to a load 16 connected to the output thereof.

In analyzing the phase relations between the input and output signals, let us denote $t_1$ as the time at which the two voltage curves intersect and $t_2$ as the time required for each of the periodic pulses rises to the intersecting point on the curves, the following relations hold:

$$V_a = E(1 - \epsilon^{-t_1/\tau_1}) \tag{1}$$

$$V_b = E(1 - \epsilon^{-t_2/\tau_2}) \tag{2}$$

$$V_a = V_b \tag{3}$$

Thus, $$t_2 = \tau_2/\tau_1 \cdot t_1 = n \, t_1 \quad (4)$$

where, $n = \tau_2/\tau_1$. By multiplying Equation 4 by $\omega$ $$\omega t_2 = \omega n \, t_1 = k \, t_1 \quad (5)$$

where, $k = \omega n$.

Equation 5 shows that the output pulse is out of phase with the input pulse by an amount $\omega t_2$ which linearly increases substantially from zero to 360°. Thus, the output pulse linearly shifts from zero to 360° relative to a reference phase which is set by the input pulse.

Figure 3:
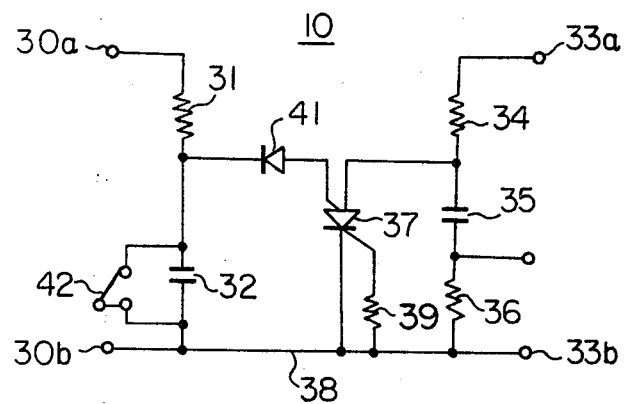
FIG. 3 is a first preferred embodiment of the phase shifting circuit of FIG. 1.

A preferred embodiment of the phase shifting circuit 10 is illustrated in FIG. 3. A step-up voltage is applied to input terminals 30a and 30b across which a delay element consisting of a resistor 31 and a capacitor 32 are connected in series. Periodic pulses are applied to input terminals 33a and 33b across which a delay element consisting of a resistor 34 and a capacitor 35 is connected as well as a resistor 36 in series therewith which serves as a load. A silicon controlled rectifier 37 has its anode electrodes connected to the capacitors 32 and 35 and has its cathode electrodes connected to lead 38 which is connected across the terminals 30b and 33b and to a resistor 39. Ths load resistance 36 may be inserted in the cathode circuit as has been described with reference to FIG. 1. A diode 41 is interposed between resistor 31 and the SCR 37 for optimum performance of the phase-shifting circuit 10. Numeral 42 is a normally closed switch and is connected across the capacitor 32 so that upon actuation thereof electrical energy is charged into the capacitor for subsequent phase shifting operation.

Figure 4:
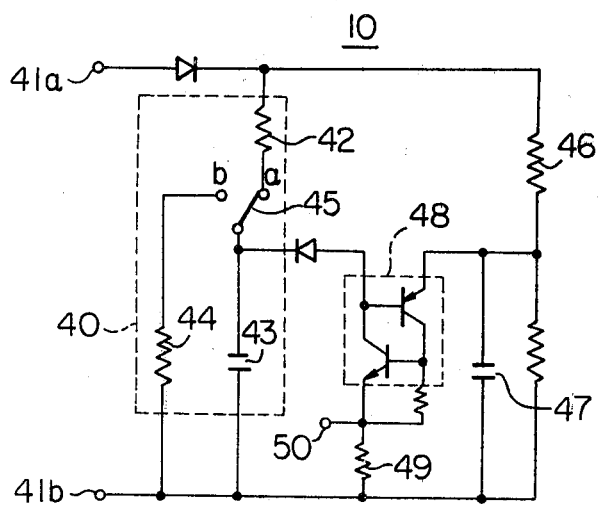
FIG. 4 is a second preferred embodiment of the phase shifting circuit of FIG. 1.

FIG. 4 illustrates another preferred embodiment of the invention. In this embodiment the general construction is similar to that shown in FIG. 3, but differs in that a charge-discharge circuit 40 is employed and use is made of only periodic pulses to be applied to input terminals 41a and 41b. The charge-discharage circuit 40 comprises a resistor 42 and a capacitor 43 for charging purposes and a resistor 44 which serves as a discharging path for the capacitor when the switch is transferred to the b position. Resistor 46 and capacitor 47 form a time constant circuit which is similar in function to the second delay element of FIG. 1. Resistor 42 and capacitor 43 have a time constant which is much smaller than that of the resistor 46 and capacitor 47 so that, upon application of periodic pulses to the input terminals, electrical energy is stored in the capacitor 43. Resistor 44 and capacitor 43 serve the function of the first delay element of FIG. 1 and have a much greater time constant than that of the second delay element, so that upon application of periodic pulses to the input terminals 41 a and 41b, electrical energy is stored instantaneously into the capacitor 43. With the electrical energy stored in the capacitor 43, operation of the switch to the b position causes the stored energy to start discharge through the resistor 44. The voltage across the capacitor 43 falls exponentially at a rate much lower than the rate at which the periodic pulses rise to the maximum value. A p-n-p-n transistor 48 is connected to the capacitors 43 and 47 so that upon coincidence of voltages across the capacitors 43 and 47 a sharp pulse is produced at the output thereof which is obtained at the load circuit including a resistance 49. In this embodiment, the phase of the output pulses shifts from substantially from 360° to 0°. The pulses obtained at the output terminal 50 can be applied to a Thyristor as a gate pulse to enable it start firing at a shifted phase angle.

Figure 5:
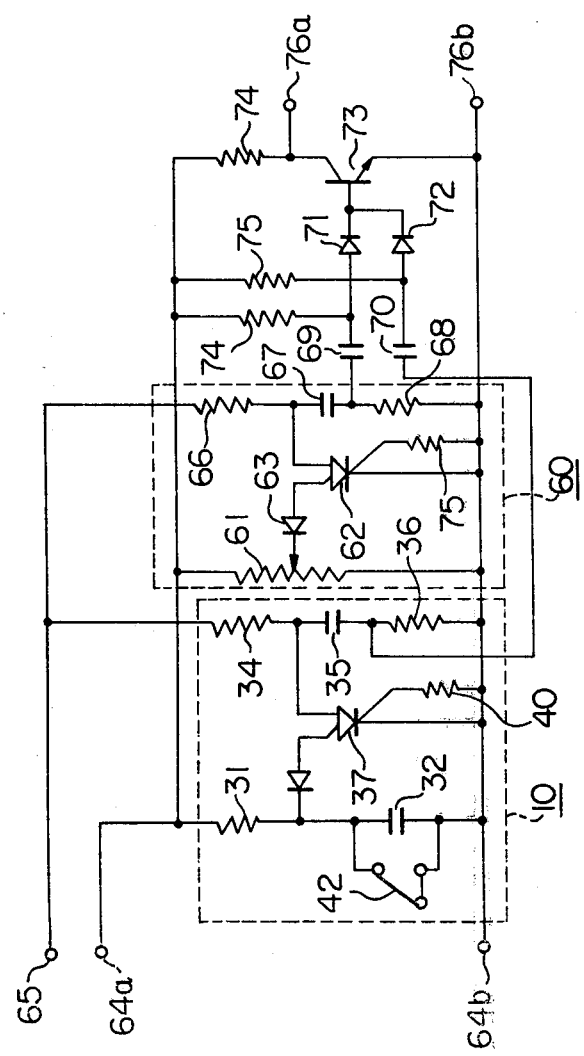
FIG. 5 is another embodiment of the present invention utilizing the first embodiment of the invention.

The phase shifting circuit 10 of FIG. 3 can be used for providing timing operation. In FIG. 5, the phase shifting circuit 10 is connected to a constant phase circuit 60 which produces periodic pulses to serve as a reference phase. The reference phase circuit 60 may be any of the type not limited to the circuit shown in FIG. 5. The output pulses obtained at these two circuits are applied to an And gate which produces an coincident output when the two signals are in coincidence. Numeral 61 is a variable resistor having its movable tap connected to an SCR 62 through diode 63. Resistor 66 and capacitor 67 are series connected to a periodic pulse input terminal 65 and have a time constant value equal to that of the second delay element of FIG. 1, that is, equal to that of resistor 34 and capacitor 35 of the phase shifting circuit 10. Therefore, it will be understood that the resistor 34 and capacitor 35 can be commonly shared with the reference phase circuit 60. In operation, the periodic pulses applied to the input terminal 65 are delayed by the time constant provided by the resistor 66 and capacitor 67, and the voltage across the capacitor 67 rises at an equal rate at which the voltage across the capacitor 35 rises. A step-up voltage is applied to input terminals 64a and 64b and divided out through the resistor tap to provide a suitable voltage level for comparison with the rising voltage of the periodic pulses. The SCR 62 compares the two voltages and delivers a signal upon coincidence therebetween. The pulses produced at the load resistance 68 occur at a constant interval and serve as a reference phase. The two output pulses obtained at the load resistances 36 and 68 are applied through capacitors 69 and 70 and diodes 71 and 72 to a transistor 73 which serves the function of an And gate. Under normal condition, the transistor 73 is rendered conductive due to the biasing voltage supplied through a pair of resistors 74 and 75. Upon coincidence of the two output pulses delivered from circuits 10 and 60, the base electrode of the transistor is biased in opposite direction and rendered nonconductive. A single pulse is obtained at output terminals 76a and 76b which indicates that a predetermined length of time has elapsed from application of both the step-up voltage and periodic pulses to the respective input terminals. The timing is determined by the rate at which the pulses shift from zero to 360° and the reference phase. The phase of the shifting pulses is determined by $\phi_t = \omega \, n \, t$ ($n = \tau_1/\tau_2$, $\tau_1 = R_{31} \cdot C_{32}$, $\tau_2 = R_{34} \cdot C_{35}$. Since the shifting phase is solely determined by the ratio of two time constants of the delay elements, the use of material having equal electrical properties would cancel disturbing factors due to the ambient temperatures. In addition, the present invention has another advantage in that the adjustment of the resistor 61 of the reference phase circuit 60 provide easy adjustment of timing, and in that a provision of a plurality of resistors in parallel connection instead of the resistor 61 permits a plurality of timing operations having different lengths of time.

What is claimed is:

1. A phase shifter comprising, a first exponential generator including a constant voltage source and a timing circuit responsive to the constant voltage source to generate a first exponential voltage curve, a second exponential generator including a pulse generating source to generate second exponential voltage curves, a solid-state switching device responsive to the outputs from said first and second generators to provide coincidence therebetween repetitiously when the voltages of the first and second curves reach the same level, whereby the point of coincidence varies linearly with time, and a load impedance responsive to the output from said switching device to develop the coincidence output.

2. A phase shifter as claimed in claim 1, wherein the voltage of said constant voltage source and said pulse generating source have the same maximum level.

3. A phase shifter comprising, a pulse generating source, a first timing circuit responsive to the pulse generating source, a second timing circuit including a charge storage circuit responsive to the pulse generating source and a discharge circuit responsive to the stored charge of said storage circuit to provide a second exponential voltage curve, a solid-state switching device responsive to the voltages of said first and second exponential curves to provide coincidence therebetween repetitiously when the voltages of the first and second curves reach the same level, and a load circuit responsive to the output from said switching device to provide the coincidence output.

4. A phase shifter as claimed in claim 3, wherein said first timing circuit has a time constant which is greater than the time constant of said charge storage circuit and smaller than said discharge circuit.

5. Timing apparatus comprising: a first exponential generator including a constant voltage source and a timing circuit responsive to the constant voltage source to generate a first exponential voltage curve, a second exponential generator including a pulse generating source and a timing circuit responsive to the pulse generating source to generate second exponential voltage curves, a solid-state switching device responsive to the outputs from said first and second generators to provide coincidence therebetween repetitiously when the voltages of the first and second curves reach the same level, whereby the point of coincidence varies linearly with respect to said train of pulses, and load impedance responsive to the output from said switching device to provide the coincidence output; and a gate circuit responsive to the outputs from said pulse generating source and said load impedance to provide coincidence therebetween.

6. A timing apparatus comprising:
a source for generating a train of regularly occurring pulses;
a source for generating a voltage of constant magnitude;
a phase-shifting circuit comprising: a first timing circuit coupled to said constant voltage source to generate an exponentially rising voltage; a second timing circuit having a smaller time constant than that of said first timing circuit and coupled to said pulse generating source to generate a train of pulses of exponentially rising voltage; and a solid-state switching device coupled to said first and second timing circuits to produce an output upon coincidence of the voltages applied thereto;
a pulse generating circuit comprising: a third timing circuit having different time constant from said first and second time constants and coupled to said pulse generating source to generate a train of pulses of exponentially rising voltage; a voltage setting means coupled to said constant voltage source and a solid-state switching device coupled to said third timing circuit and to said voltage setting means to produce an output upon coincidence of the voltages applied thereto; and
a gate circuit receptive of the outputs from said phase shifting circuit and said pulse generating circuit.

* * * * *